(12) United States Patent
Greeley et al.

(10) Patent No.: US 7,585,782 B2
(45) Date of Patent: Sep. 8, 2009

(54) METHODS OF FORMING SEMICONDUCTOR CONSTRUCTIONS, AND METHODS OF SELECTIVELY REMOVING METAL-CONTAINING MATERIALS RELATIVE TO OXIDE

(75) Inventors: Joseph N. Greeley, Boise, ID (US); Paul A. Morgan, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 169 days.

(21) Appl. No.: 11/402,698

(22) Filed: Apr. 11, 2006

(65) Prior Publication Data
US 2007/0238287 A1 Oct. 11, 2007

(51) Int. Cl.
*H01L 21/22* (2006.01)
*H01L 21/38* (2006.01)

(52) U.S. Cl. .............. 438/754; 438/644; 257/E21.483; 257/E21.582

(58) Field of Classification Search ................. 438/629, 438/754, 643, 644; 257/E21.483, E21.485, 257/E21.582
See application file for complete search history.

(56) References Cited

U.S. PATENT DOCUMENTS

| | | | |
|---|---|---|---|
| 5,376,236 A * | 12/1994 | Hanson et al. | 216/108 |
| 6,261,427 B1 | 7/2001 | Rolfson | 204/224 |
| 6,790,130 B2 | 9/2004 | Doan et al. | 451/41 |
| 2006/0138399 A1 * | 6/2006 | Itano et al. | 257/40 |
| 2008/0042282 A1 * | 2/2008 | Saito et al. | 257/751 |

\* cited by examiner

*Primary Examiner*—Caridad M Everhart
(74) *Attorney, Agent, or Firm*—Wells St. John P.S.

(57) ABSTRACT

The invention includes methods of selectively removing metal-containing copper barrier materials (such as tantalum-containing materials, titanium-containing materials and tungsten-containing materials) relative to oxide (such as silicon dioxide) and/or copper. The selective removal can utilize etchant solutions containing hydrofluoric acid and one or more carboxylic acids. The etchant solutions can contain less than 6 weight percent water, and/or can have a dielectric constant below 40.

19 Claims, 7 Drawing Sheets

METHODS OF FORMING SEMICONDUCTOR CONSTRUCTIONS, AND METHODS OF SELECTIVELY REMOVING METAL-CONTAINING MATERIALS RELATIVE TO OXIDE

TECHNICAL FIELD

The invention pertains to methods of forming semiconductor constructions, and in particular aspects pertains to methods of selectively removing metal-containing copper barrier materials relative to oxide (for example, silicon dioxide) and/or relative to copper.

BACKGROUND OF THE INVENTION

Semiconductor fabrication frequently involves removal of metal-containing materials from over underlying insulative materials. Such removal can be accomplished by chemical-mechanical polishing (CMP) of metal-containing material. However, some insulative materials have relatively weak structural stability (for instance, some are highly porous), and the downward pressure associated with CMP can damage such materials. This can be particularly problematic when removing relatively hard metal-containing materials, such as, for example, tantalum-containing materials. It would therefore be desirable to develop new methods for removing metal-containing materials.

SUMMARY OF THE INVENTION

In one aspect, the invention includes a method of selectively removing a metal-containing material relative to a dielectric material. The metal-containing material and the dielectric material are exposed to an etchant solution containing fluoride ions and having a dielectric constant below 40.

In another aspect, the invention includes a method of forming a semiconductor construction. A dielectric material is provided, and a layer of barrier material is formed across at least some of the dielectric material. Copper-containing material is formed to be across only some of the barrier material, and to leave a portion of the barrier material uncovered. The copper-containing material is spaced from the dielectric material by at least the barrier material. At least some of the barrier material is selectively removed relative to the dielectric material utilizing an etchant solution containing hydrofluoric acid and one or more carboxylic acids.

In yet another aspect, the invention includes another method of forming a semiconductor construction. A semiconductor base is provided, and an oxide is formed over the base. A trench is formed within the oxide. A layer of barrier material is formed within the trench and over the oxide adjacent the trench. The barrier material narrows the trench. Copper-containing material is formed within the narrowed trench and over the barrier material adjacent the trench. The copper-containing material is removed from over some of the barrier material while leaving the copper-containing material within the trench. The removal of the copper-containing material from over some of the barrier material exposes said some of the barrier material. At least a portion of the exposed barrier material is selectively removed relative to the oxide utilizing an etchant solution containing hydrofluoric acid and less than 6 weight percent water.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In some aspects, the invention includes non-mechanical etch strategies for removing tantalum-containing barrier materials selectively relative to copper-containing materials and dielectric materials. The etch strategies can also be utilized for removing tantalum-containing materials in applications other than as barrier materials. The etch strategies can be extended for utilization with other metal-containing materials besides tantalum-containing materials. The etch strategies can include utilization of hydrofluoric acid and one or more carboxylic acids in an etchant solution. The etchant solution can have less than 6 weight percent water, and can have a dielectric constant of less than 40.

Exemplary aspects of the invention are described with reference to FIGS. 1-13.

Figure 1:
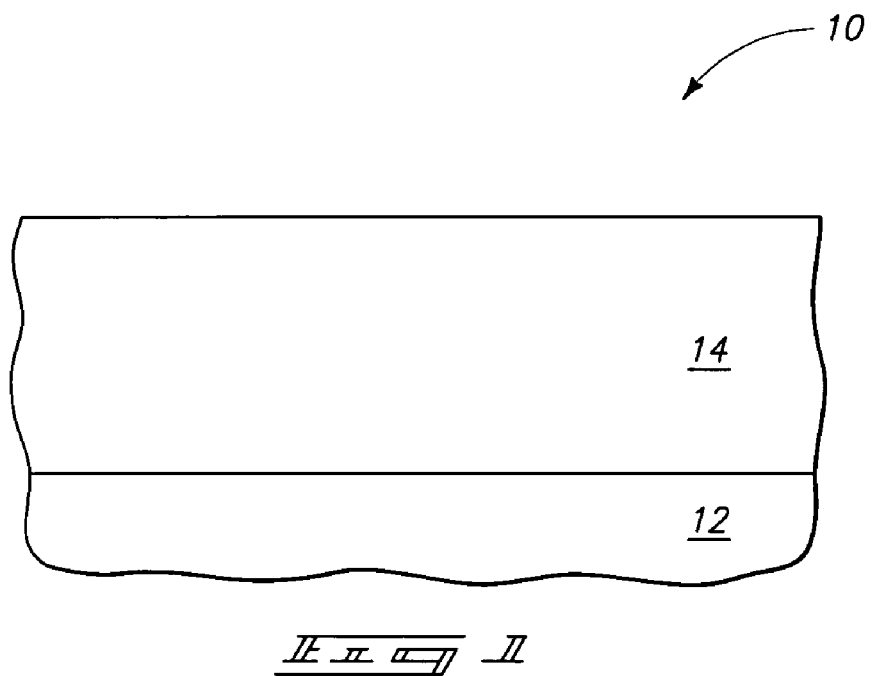
FIG. 1 is a diagrammatic, cross-sectional view of a semiconductor wafer fragment shown at a preliminary processing stage of an exemplary aspect of the present invention.

Referring to FIG. 1, a semiconductor construction 10 is illustrated at a preliminary processing stage. The construction includes a semiconductor substrate 12 and a dielectric material 14 over the semiconductor substrate.

Various integrated circuit components (not shown) can be associated with the substrate, as is known to persons of ordinary skill in the art. Such integrated circuit components can include various conductive materials, insulative materials and/or semiconductor materials. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The semiconductor substrate can be considered to include a semiconductor base corresponding to semiconductor material of the substrate, and in some aspects corresponding to bulk monocrystalline silicon.

Dielectric material 14 can comprise any suitable composition or combination of compositions. In some aspects, dielectric material 14 can comprise, consist essentially of, or consist of an oxide. Suitable oxide can be silicon dioxide and/or doped silicon dioxide (such as, for example, borophosphosilicate glass, BPSG; phosphosilicate glass, PSG; or fluorosilicate glass, FSG). The silicon dioxide and/or doped silicon dioxide of material 14 can be highly porous in particular aspects of the invention, and thus subject to damage if excess pressure is applied. In some aspects, dielectric material 14 can comprise one or more so-called low-k materials, either in addition to silicon dioxide, or alternatively to silicon dioxide.

Figure 2:
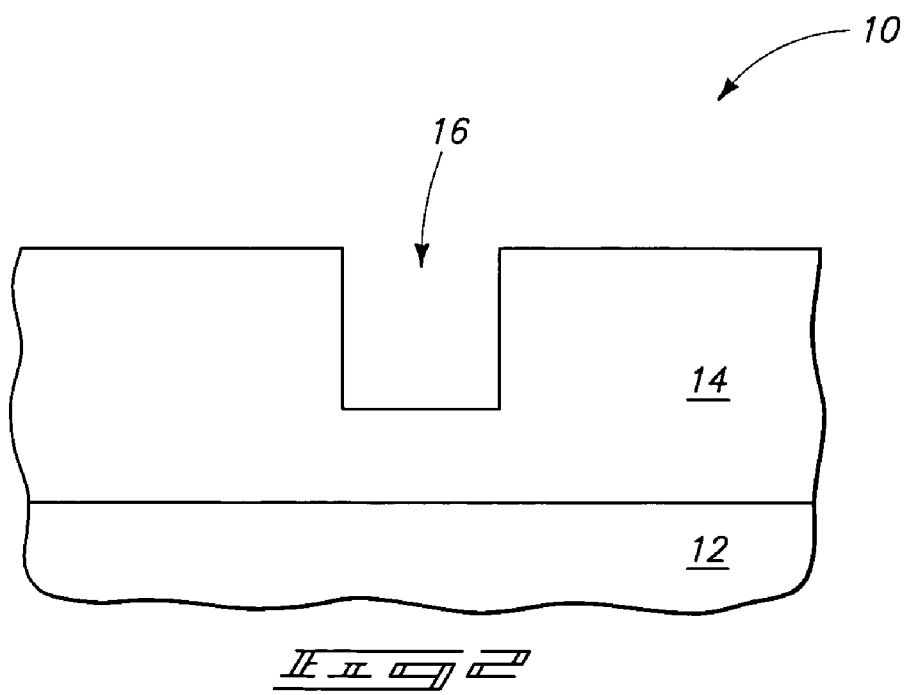
FIG. 2 is a view of the FIG. 1 wafer fragment shown at a processing stage subsequent to that of FIG. 1.

Referring to FIG. 2, a trench 16 is formed within dielectric material 14. The trench can extend in and out of the page relative to the shown cross-sectional view.

Figure 3:
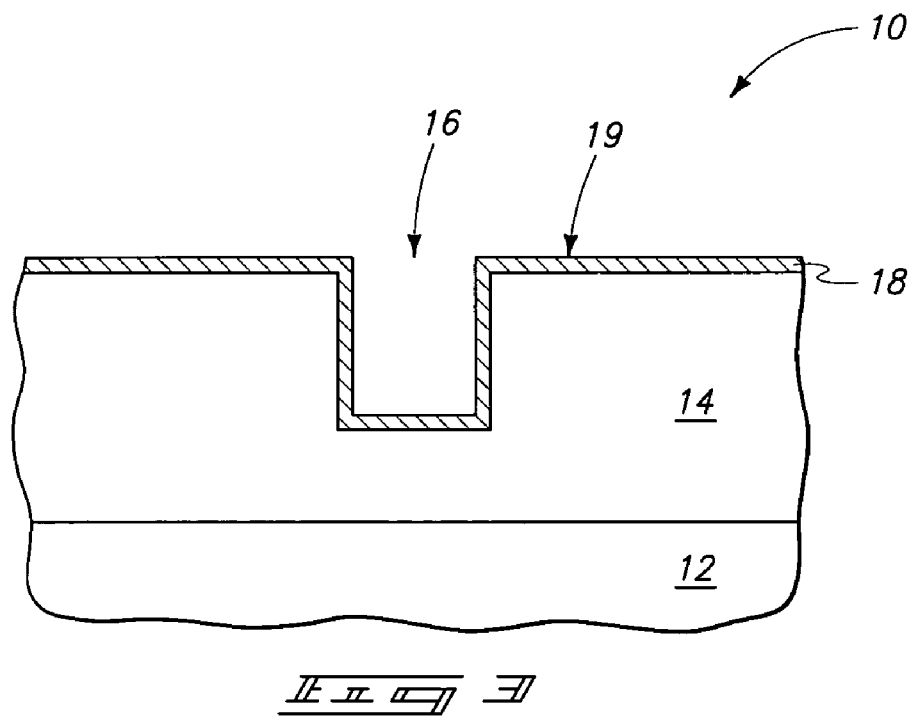
FIG. 3 is a view of the FIG. 1 wafer fragment shown at a processing stage subsequent to that of FIG. 2.

Referring to FIG. 3, a metal-containing layer 18 is formed over dielectric material 14 and within the trench 16. The metal-containing layer 18 can be a barrier to copper diffusion, and can be provided between a copper-containing material (discussed below with reference to FIG. 4) and dielectric material 14.

Metal-containing layer 18 can comprise any suitable composition or combination of compositions. In particular aspects, layer 18 can comprise, consist essentially of, or consist of one or more of titanium, titanium-containing compositions (for instance, titanium nitride), tantalum, tantalum-containing compositions (for instance, tantalum nitride), tungsten, and tungsten-containing compositions (for instance, tungsten nitride).

The metal-containing layer 18 can be formed to any suitable thickness, and in particular aspects will be formed to a thickness of about 150 angstroms. The metal-containing layer 18 has an uppermost surface 19.

Layer 18 partially fills trench 16, and thus narrows the trench. In the shown aspect of the invention, metal-containing layer 18 extends entirely across the shown segment of dielectric material 14. It is to be understood that the invention includes other aspects (not shown) in which the metal-containing layer extends only partially across dielectric material 14. Regardless, the metal-containing layer will typically be formed within the trench and over portions of dielectric material 14 adjacent the trench.

Figure 4:
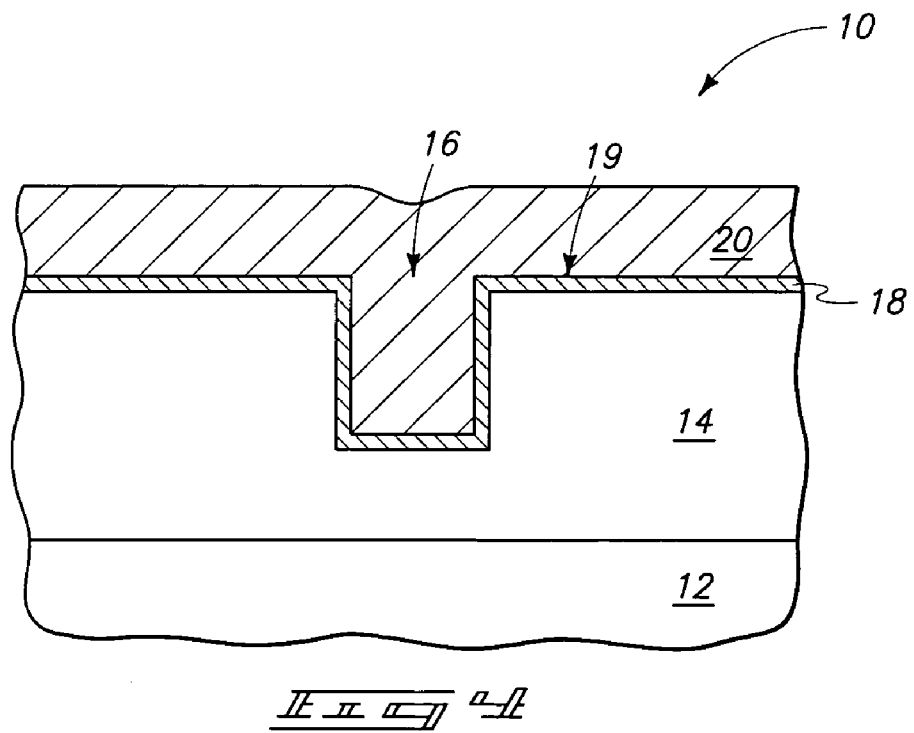
FIG. 4 is a view of the FIG. 1 wafer fragment shown at a processing stage subsequent to that of FIG. 3.

Referring to FIG. 4, a copper-containing material 20 is formed over layer 18 and within the narrowed trench 16. Copper-containing material 20 can comprise, consist essentially of, or consist of copper. The copper-containing material is spaced from dielectric material 14 by metal-containing layer 18. In particular aspects, the metal-containing layer 18 can correspond to barrier material preventing copper diffusion from copper-containing material 20 into dielectric material 14.

Figure 5:
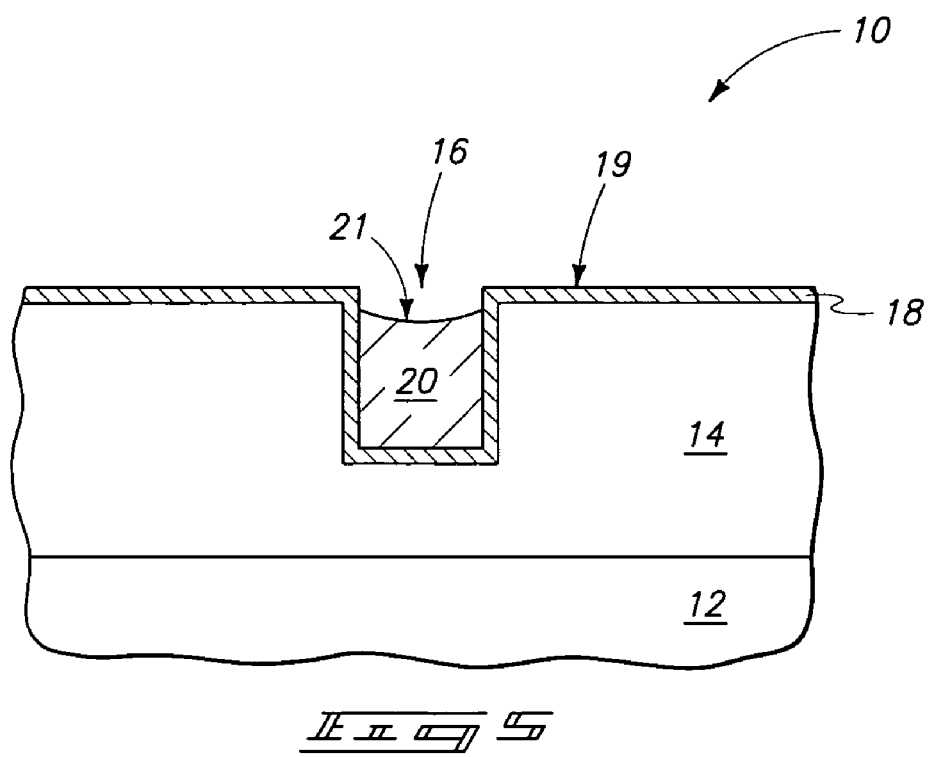
FIG. 5 is a view of the FIG. 1 wafer fragment shown at a processing stage subsequent to that of FIG. 4.

Referring to FIG. 5, copper-containing material 20 is removed from over some of metal-containing layer 18, but left within trench 16. Such removal can be accomplished by, for example, CMP. The copper-containing material is softer than the metallic materials traditionally utilized as copper barrier materials, and thus the copper barrier materials of layer 18 can function as an etch stop during CMP removal of copper-containing material 20 from regions outside of trench 16.

The copper-containing material 20 remaining within the trench is shown to have a dished upper surface 21 at the processing stage of FIG. 5, and the upper surface 21 is shown to be recessed relative to the uppermost surface 19 of layer 18. Such dishing can result during CMP removal of copper-containing material 20 due to the relative softness of material 20 as compared to material 19. It is to be understood that the dishing and recessing of the uppermost surface of copper-containing material 20 may not occur in some fabrication processes, as discussed in more detail below with reference to FIG. 11.

The removal of copper-containing material from over uppermost surface 19 of layer 18 has exposed the portion of layer 18 outside of trench 16, and has also exposed some of the layer 18 within the trench along sidewalls of the remaining copper-containing material 20. The processing stage of FIG. 5 can be considered to comprise the copper-containing material 20 across only some of metal-containing layer 18 (which in some aspects can be considered to be a barrier material 18, as discussed above), so that a portion of the metal-containing layer 18 is not covered.

Figure 6:
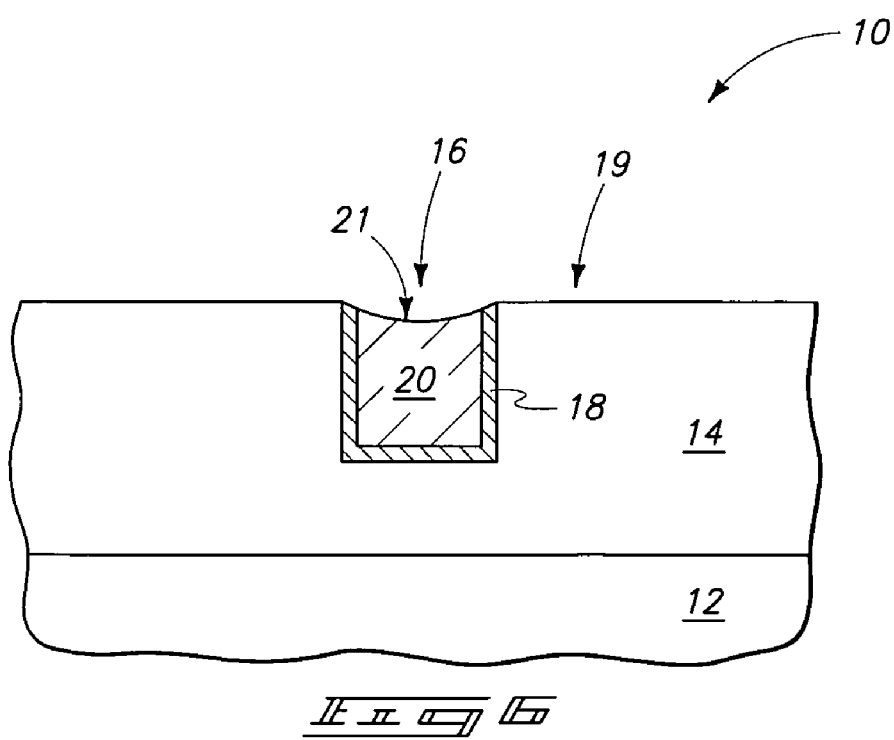
FIG. 6 is a view of the FIG. 1 wafer fragment shown at a processing stage subsequent to that of FIG. 5.

Referring to FIG. 6, exposed portions of metal-containing material 18 (FIG. 5) are selectively removed relative to dielectric material 14 and copper-containing material 20. For purposes of interpreting this disclosure, an etch is considered to be selective for a first material relative to a second material if the etch removes the first material at a faster rate than the second material, which can include, but is not limited to, etches which are 100 percent selective for the first material relative to the second material.

The selective removal of metal-containing material 18 is accomplished with an etchant solution containing hydrofluoric acid. At least some of the hydrofluoric acid will typically be dissociated into fluoride ions and protons at the pHs at which the etchant will generally be utilized. It can be preferred that the etchant have a relatively low dielectric constant to alleviate removal of dielectric material 14 by the hydrofluoric acid, and thus maintain selectivity of the etch for metal-containing material 18 relative to the dielectric material. Hydrofluoric acid will typically remove silicon dioxide at a rapid rate if the hydrofluoric acid is present in an etchant having a high dielectric constant (for instance, a dielectric constant greater than 60). Accordingly, it can be desired that the dielectric constant of the etchant utilized for removing metal-containing material 18 be less than 40, less than 30, less than 20, less than 10, or even less than 6.

The dielectric constant of the etchant can be kept relatively small by substantially excluding substances having high dielectric constants, such as water (which has a dielectric constant of about 80 at room temperature, and about 67 at 60° C.), and instead solvating the hydrofluoric acid in substances having relatively low dielectric constants, such as various carboxylic acids. For instance, acetic acid (HOAc) has a dielectric constant of about 6.2, propanoic acid has a dielectric constant of about 3.4, and butanoic acid has a dielectric constant of about 3.0.

Further advantages of utilizing the carboxylic acids in etchants of the present invention is that such can be obtained with very low water content, as opposed to mineral acids; and the carboxylic acids will tend to be relatively non-reactive toward copper of material 20 in comparison to various mineral acids. Also, the carboxylic acids may advantageously assist in removal of metal-containing material 18 by initially oxidizing the material to convert the material to forms which can be readily removed by the hydrofluoric acid. For instance, if material 18 comprises tantalum, such may be oxidized by carboxylic acid (for instance, acetic acid) to form $TaO_x$, which is then readily removed by the hydrofluoric acid. The mechanism of having the carboxylic acids oxidize metal of material 18 is provided herein to assist the reader in understanding some aspects of the invention, and is not to limit the invention except to the extent, if any, that such mechanism is expressly recited in the claims that follow.

In particular aspects, the etchant solution will comprise, consist essentially of, or consist of hydrofluoric acid (HF), water ($H_2O$) and one or more of acetic acid, propanoic acid and butanoic acid; with the etchant solution being formed by combining commercially available starting materials of high concentration (and corresponding low water content), and the water present in the etchant solution being only due to the amount originally present in the starting materials. For instance, an etchant solution can be formed by combining glacial acetic acid (99.5% acetic acid by weight, and the remainder water) with 50% hydrofluoric acid (50% hydrofluoric acid by weight, and the remainder water) in a ratio of from 10:1 (HOAc:HF) to 100:1 (HOAc:HF), resulting in solutions having from about 1 weight % water to about 5 weight % water. It can be preferred that the etchant solutions have less than 6 weight % water, less than 5 weight % water, less than 3 weight % water or even less than or equal to 1 weight % water, in some aspects of the invention. Exemplary etchant solutions can comprise from about 90 weight % acetic acid to about 99 weight % acetic acid, and from about 0.5 weight % hydrofluoric acid to about 5 weight % hydrofluoric acid.

The etchant solution containing the various acids will actually contain various equilibrium forms of the acids, as will be recognized by persons of ordinary skill in the art, with the relative abundance of the equilibrium forms depending on the pH of the etchant solution. Thus, an etchant solution referred to as containing a particular weight % of hydrofluoric acid is to be understood as containing the various equilibrium species, HF, $H^+$, and $F^-$ to a total combined concentration of the weight %; and with the relative abundance of the various species depending on the pH of the etchant solution. Similarly, an etchant solution referred to as containing a particular weight % of HOAc is to be understood as containing the various equilibrium species, HOAc, $H^+$, and acetate anion, to a total combined concentration of the weight %; and with the relative abundance of the various species depending on the pH of the etchant solution.

The etching of metal-containing material 18 can be conducted under any suitable conditions. In particular aspects, construction 10 is dipped within the etchant solution, and the etchant solution is maintained at a temperature of from at least about 20° C. to less than or equal to about 60° C. during the removal of metal-containing material 18. It can be preferred that the temperature be at the higher end of the range during such removal. The temperature can be maintained with any suitable heating, including radiant heating and/or microwave heating. In exemplary aspects, metal-containing material 18 consists of tantalum or tantalum nitride, and has a thickness of less than or equal to about 150 angstroms; and the etching is conducted for a time of less than or equal to about three minutes—with a time of about three minutes at a temperature of about 60° C. being suitable for removing about 150 angstroms of the tantalum-containing material utilizing an etchant containing hydrofluoric acid and acetic acid.

Figure 7:
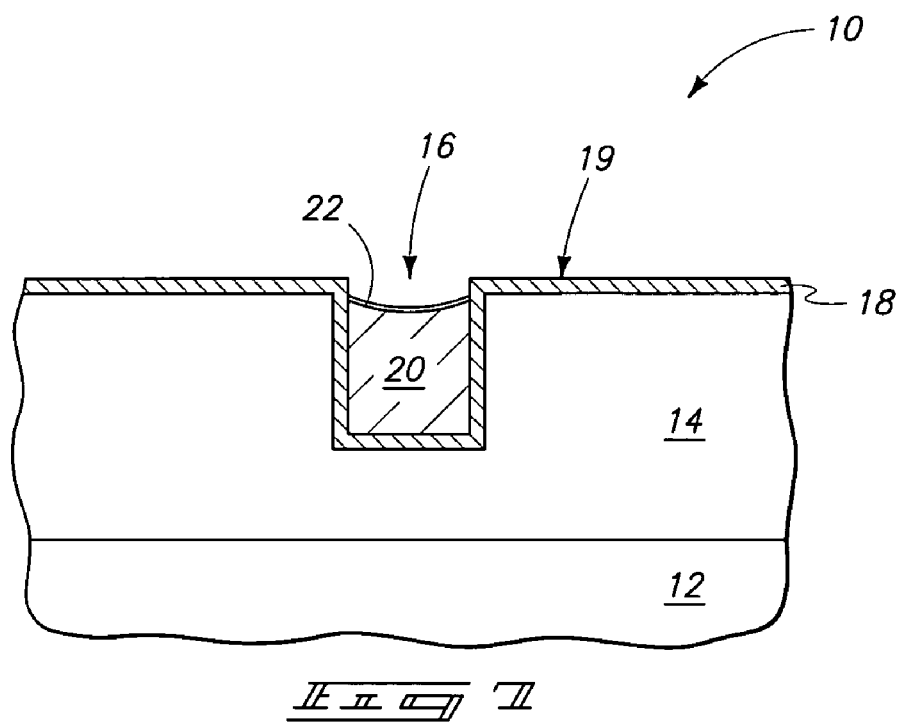
FIG. 7 is a view of the FIG. 1 wafer fragment shown at a processing stage subsequent to that of FIG. 5 in accordance with another aspect of the present invention.
Figure 8:
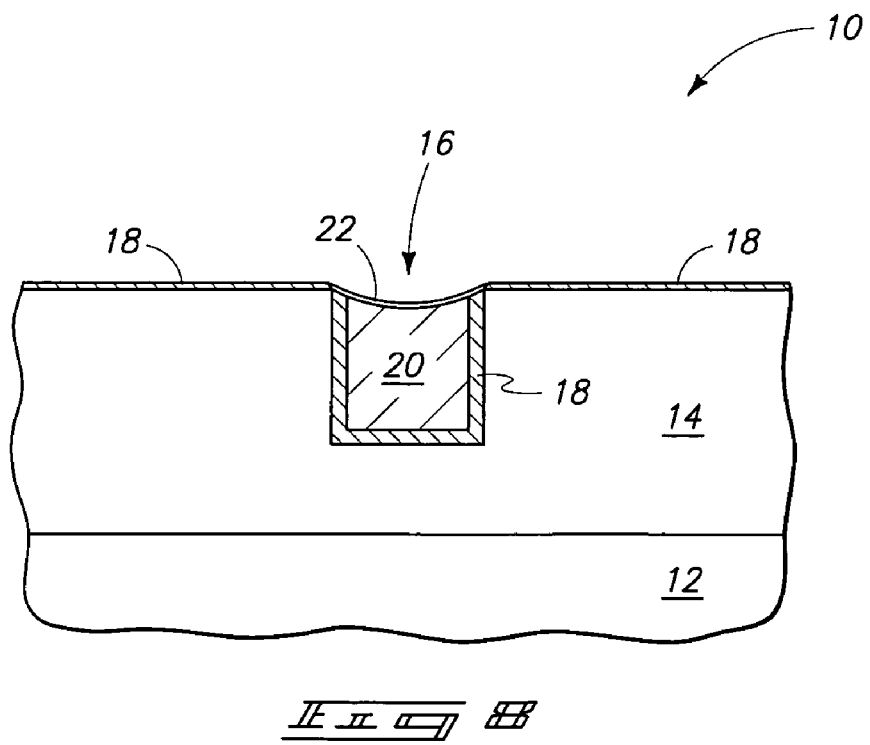
FIG. 8 is a view of the FIG. 7 wafer fragment shown at a processing stage subsequent to that of FIG. 7.
Figure 9:
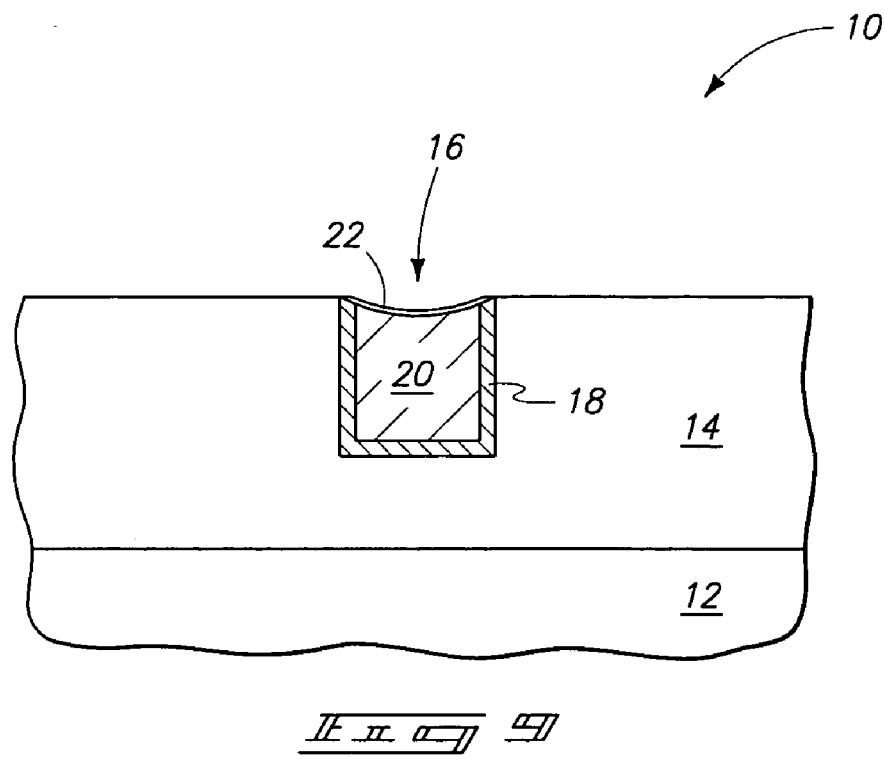
FIG. 9 is a view of the FIG. 7 wafer fragment shown at a processing stage subsequent to that of FIG. 8.

The construction of FIG. 6 represents an idealized structure in that the remaining material 18 extends entirely along sidewalls of copper-containing material 20 after the etching of material 18, rather than being recessed along the sidewalls during the etching of the material. One method of obtaining such idealized structure is to protect portions of material 18 most proximate copper-containing material 20 during the etching of material 18 so that such portions remain after the removal of the rest of material 18. FIGS. 7-9 illustrate an exemplary method for protecting portions of material 18 that are within the trench and along sidewalls of copper-containing material 20.

Referring to FIG. 7, such shows a layer 22 forming over copper-containing material 20. The layer 22 can be formed during initiation of the etching of material 18 with the etchant solution by including one or more protective components within the etchant solution which interact with copper-containing material 20 to form the protective layer 22. Exemplary components suitable to form such protective layer can comprise, consist essentially of, or consist of one or more of chloride, oxalate, succinate, citrate, benzotriazine and bis (sodium sulfopropyl) disulfide. The chloride, oxalate, succinate and citrate can be provided in the etchant solution in the form of any of various salts, including, for example, ammonium salts and potassium salts. The concentration of the various protective components will be determined by the weight of the salt provided in the etchant solution, and an exemplary total concentration of the components is from about 0.5 ppm to about 5 ppm (by weight).

FIG. 8 shows construction 10 at a processing stage subsequent to that of FIG. 7, and specifically after some etching of material 18 has occurred. The protective layer 22 continues to form across the exposed surface of material 20, and the growing layer 22 spreads over the material 18 proximate material 20. Such forms a protective covering over the material 18 which is proximate material 20, and in the shown aspect forms the protective covering over the material 18 within trench 16. The portion of material 18 protected by the protective layer 22 can be referred to as a first portion, and the portion of material 18 which is not covered by the protective layer 22 can be referred to as a second portion of material 18. The second portion is exposed to the etchant solution, and thus removed by the etchant solution; whereas the first portion of material 18 is not exposed to the etchant solution. Continued exposure to the etchant solution forms the construction of FIG. 9.

In some aspects, it can be desired to remove protective material 22 from over copper-containing material 20 and metal-containing layer 18 after the protective material has served the function of protecting the first portion of layer 18 during the removal of the remainder of layer 18. The protective material 22 can be removed with any suitable processing, including, for example, any appropriate etch. If desired, a protective mask (such as a patterned photoresist mask) can be provided over exposed dielectric material 14 during the removal of material 22.

Figure 10:
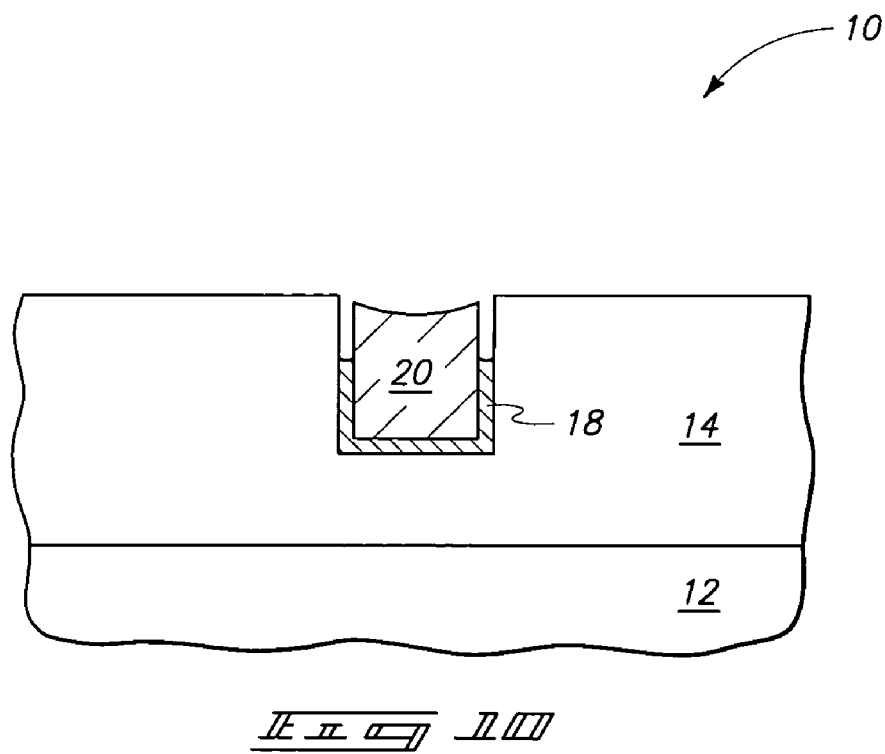
FIG. 10 is a view of the FIG. 1 wafer fragment shown at a processing stage subsequent to that of FIG. 5, and illustrating results of a process alternative to the processing described with reference to FIG. 6, and alternative to the processing described with reference to FIGS. 7-9.

The processing of FIGS. 7-9 advantageously protects material of layer 18 from being recessed along a sidewall edges of copper-containing material 20. FIG. 10 shows construction 10 at a processing stage subsequent to that of FIG. 5 in an aspect in which layer 18 is recessed along sidewall edges of copper-containing material 20. Such undesirably removes the barrier of layer 18 from between copper-containing material 20 and dielectric material 14 along some regions of copper-contain material 20, which can problematically lead to diffusion of copper from material 20 into the dielectric material.

Figure 11:
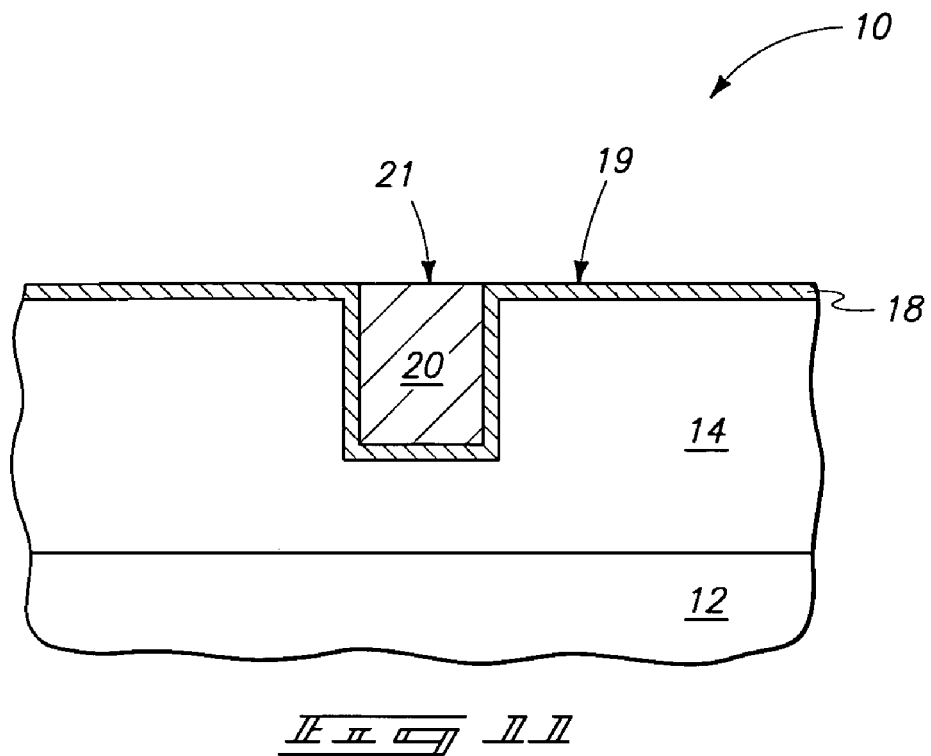
FIG. 11 is a view of the FIG. 1 wafer fragment shown at a processing stage subsequent to that of FIG. 3 in accordance with yet another embodiment of the present invention.

The processing discussed above with reference to FIG. 5 shows copper-containing material 20 having an upper surface 21 recessed to beneath the upper surface 19 of metal-containing material 18. The invention can also include aspects in which the upper surface 21 of copper-containing material 20 is coplanar with the upper surface 19 of metal-containing material 18 prior to removal of material 18 with an etchant solution. FIG. 11 shows a processing stage analogous to that of FIG. 5, but with upper surface 21 of copper-containing material 20 being coplanar with upper surface 19 of metal-containing material 18. The processing stage of FIG. 9 can result from CMP of the construction of FIG. 4.

Figure 12:
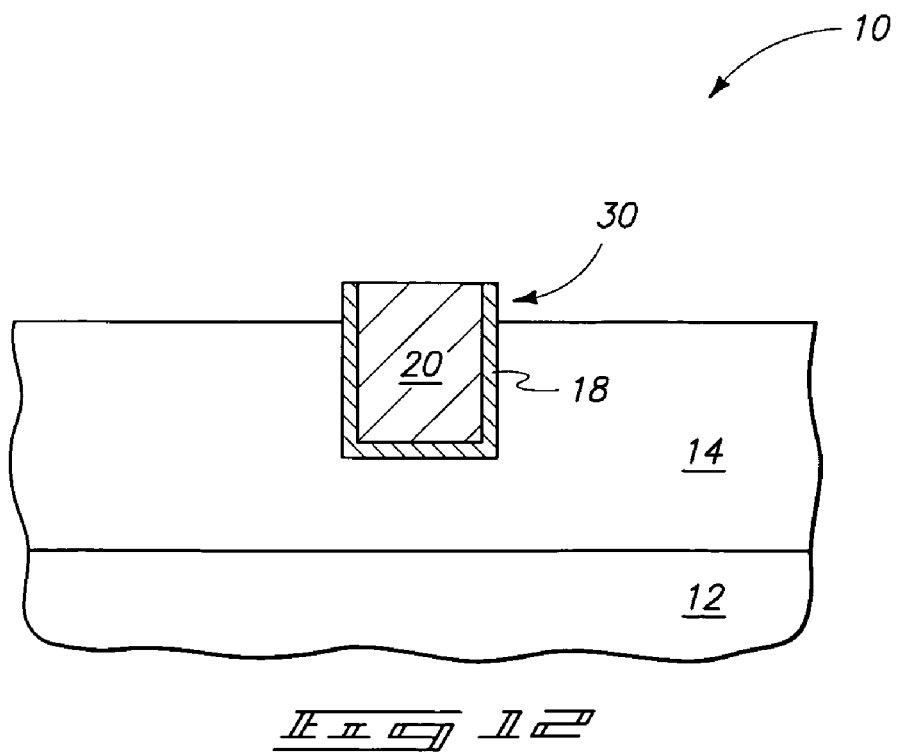
FIG. 12 is a view of the FIG. 11 wafer fragment shown at a processing stage subsequent to that of FIG. 11.
Figure 13:
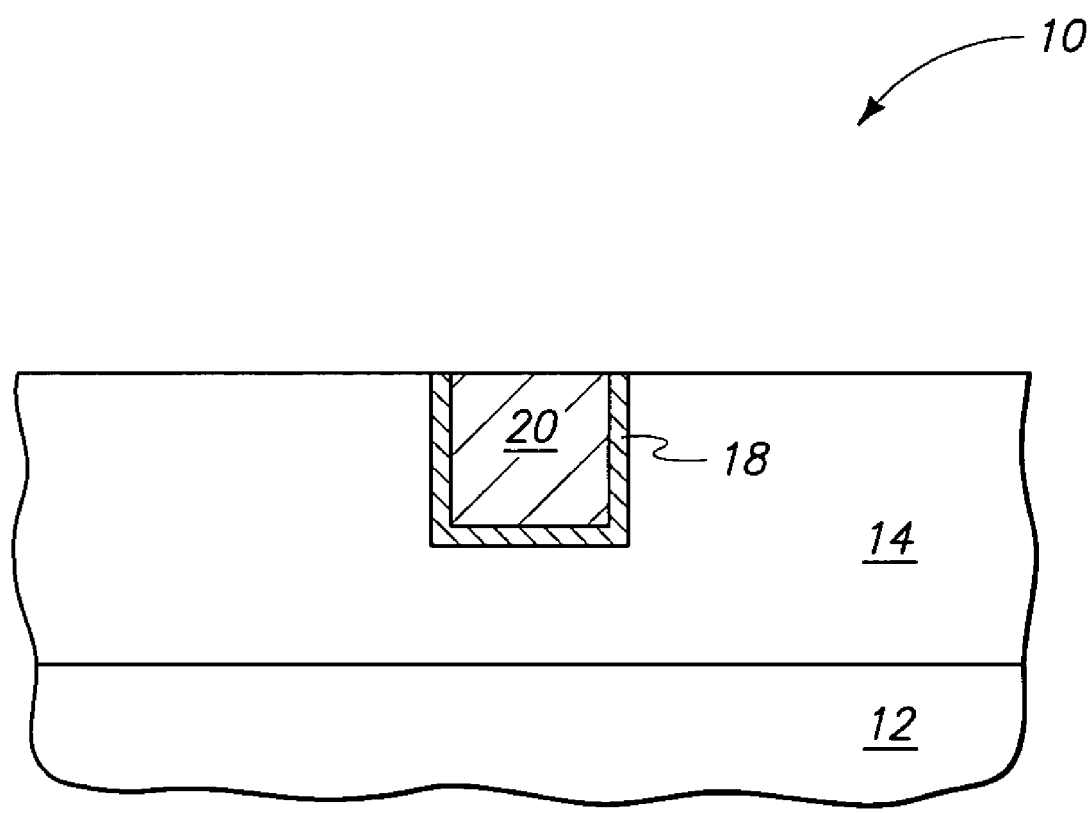
FIG. 13 is a view of the FIG. 11 wafer fragment shown at a processing stage subsequent to that of FIG. 12.

FIG. 12 shows construction 10 at a processing stage subsequent to that of FIG. 11, and specifically after removal of metal-containing material 18 with processing analogous to that discussed above with reference to previous aspects of the invention. Such processing can utilize an etchant solution selective for removal of material of layer 18, and containing appropriate components to form a layer analogous to the layer 22 of FIG. 9, even though such layer is not shown in FIG. 12.

The construction of FIG. 12 is at a processing stage comparable to the stages shown in FIGS. 6 and 9, but the construction of FIG. 12 differs from the constructions of FIGS. 6 and 9 by having a conductive segment 30 of copper-containing material 20 and metal-containing layer 18 projecting above an uppermost surface of dielectric material 14.

The conductive segment can remain in place in some aspects. In other aspects, the conductive segment can be removed by suitable processing to form the construction shown in FIG. 13. Suitable processing can include, for example, an etch of the conductive material, and/or planarization of the conductive material. In some aspects, exposed portions of dielectric material 14 can be protected with a patterned mask (not shown) during removal of the projecting conductive segment 30 (FIG. 12). The patterned mask can comprise, for example, photolithographically patterned photoresist.

The copper-containing material 20 and conductive barrier layer 18 patterned in accordance with any of the above-described aspects of the present invention can be utilized as electrical interconnects in integrated circuit constructions. The various constructions shown and described in this disclosure can be considered to be semiconductor constructions to the extent that such constructions comprise semiconductor materials.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of selectively removing a metal-containing material relative to a dielectric material, comprising:
    exposing a layer of metal-containing material and a dielectric material to a non-mechanical wet etch utilizing an etchant solution containing fluoride ions and less than 6 weight percent water, the exposing removing an entire thickness of portions of the layer of metal-containing material;
    wherein the etchant solution has a dielectric constant below 40;
    wherein the metal-containing material comprises one or both of tantalum and tungsten; and
    wherein the dielectric material comprises silicon dioxide.

2. The method of claim 1 wherein a temperature of the etchant solution is maintained at from at least about 20° C. to less than or equal to about 60° C. during the exposure.

3. The method of claim 1 wherein the metal-containing material has an initial thickness of less than or equal to about 150 Å, and wherein the exposure is conducted for a time of less than or equal to about three minutes.

4. The method of claim 1 wherein the dielectric constant of the etchant solution is below 30.

5. The method of claim 1 wherein the dielectric constant of the etchant solution is below 20.

6. The method of claim 1 wherein the dielectric constant of the etchant solution is below 10.

7. The method of claim 1 wherein the etchant solution comprises HF and one or more carboxylic acids.

8. The method of claim 1 wherein the metal-containing material comprises tantalum.

9. The method of claim 1 wherein the metal-containing material consists of tantalum.

10. The method of claim 1 wherein the metal-containing material comprises tantalum nitride.

11. The method of claim 1 wherein the metal-containing material comprises tungsten.

12. The method of claim 1 wherein the metal-containing material consists of tungsten.

13. The method of claim 1 wherein the metal-containing material comprises tungsten nitride.

14. A method of forming a semiconductor construction, comprising:
    providing a dielectric material;
    forming a layer of barrier material across at least some of the dielectric material;
    forming copper-containing material to be across only some of the barrier material and to leave a portion of the barrier material uncovered; the copper-containing material being spaced from the dielectric material by at least the barrier material;
    selectively removing an entire thickness of at least some portions of the layer of the barrier material relative to the dielectric material utilizing a non-mechanical wet etch with an etchant solution containing hydrofluoric acid and one or more carboxylic acids with less than 6 weight percent water;
    wherein the barrier material comprises one or both of tantalum and tungsten; and
    wherein the dielectric material comprises silicon dioxide.

15. The method of claim 14 wherein a first portion of the uncovered barrier material is proximate the copper-containing material and a second portion of the uncovered barrier material is not proximate the copper-containing material; and further comprising including one or more components within the etchant solution which interact with the copper-containing material and form a protective layer protecting the first portion of the barrier material and not the second portion; and wherein the removal of the barrier material removes the unprotected second portion of the barrier material and does not remove the protected first portion of the barrier material.

16. The method of claim 14 wherein the etchant solution has a dielectric constant below 40.

17. The method of claim 16 wherein the dielectric constant of the etchant solution is below 30.

18. The method of claim 16 wherein the dielectric constant of the etchant solution is below 20.

19. The method of claim 16 wherein the dielectric constant of the etchant solution is below 10.

* * * * *